United States Patent
Ikeda

(10) Patent No.: US 9,066,065 B2
(45) Date of Patent: Jun. 23, 2015

(54) REPRODUCTION APPARATUS AND METHOD OF CONTROLLING REPRODUCTION APPARATUS

(71) Applicant: CANON KABUSHIKI KAISHA, Tokyo (JP)

(72) Inventor: Shingo Ikeda, Tama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1 day.

(21) Appl. No.: 14/015,597

(22) Filed: Aug. 30, 2013

(65) Prior Publication Data

US 2014/0064710 A1 Mar. 6, 2014

(30) Foreign Application Priority Data

Sep. 3, 2012 (JP) .................................. 2012-192926

(51) Int. Cl.
*H04N 5/91* (2006.01)
*H04N 5/77* (2006.01)
*H04N 9/82* (2006.01)
*H01L 27/146* (2006.01)

(52) U.S. Cl.
CPC ................. *H04N 5/91* (2013.01); *H04N 5/772* (2013.01); *H04N 9/8211* (2013.01); *H01L 27/14601* (2013.01); *H01L 27/14627* (2013.01)

(58) Field of Classification Search
CPC . H04N 5/23212; H04N 5/23245; H04N 5/91; H04N 5/722
See application file for complete search history.

(56) References Cited

U.S. PATENT DOCUMENTS 4,410,804 A 10/1983 Stauffer
2013/0076930 A1* 3/2013 Border et al. .............. 348/222.1

\* cited by examiner

*Primary Examiner* — Huy T Nguyen
(74) *Attorney, Agent, or Firm* — Canon U.S.A.Inc., IP Division

(57) ABSTRACT

A reproduction apparatus and method for controlling the reproduction apparatus includes acquiring an image capable of refocusing, acquiring audio associated with image capable of refocusing, and controlling a the timing of an output of the audio in accordance with the refocus position of the image.

10 Claims, 10 Drawing Sheets

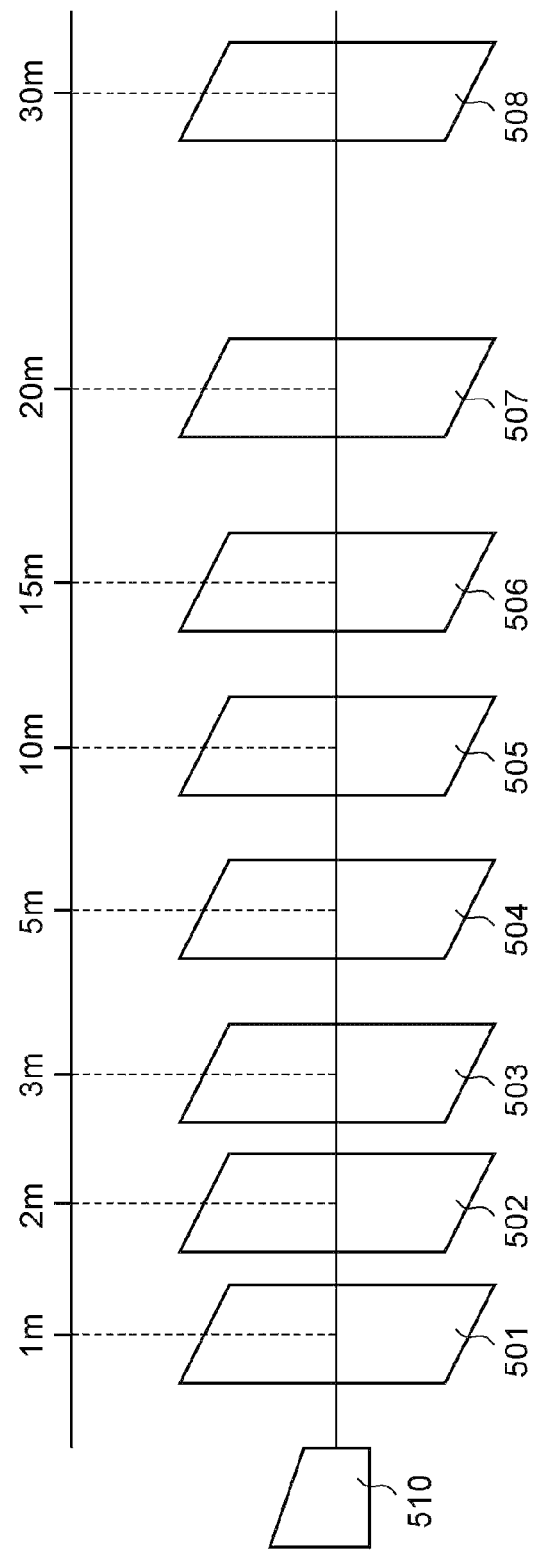

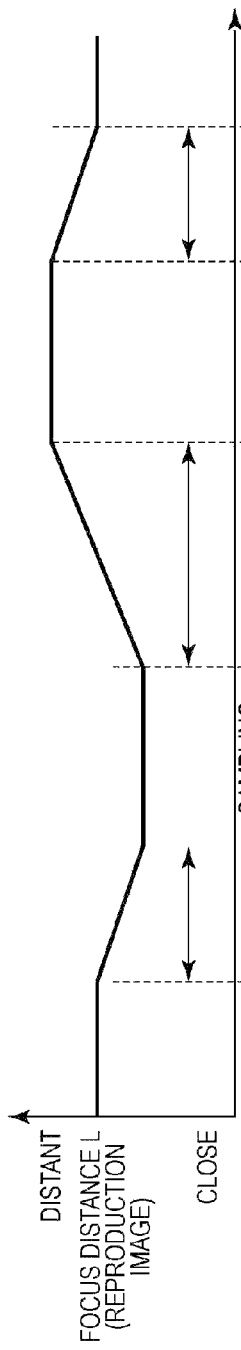
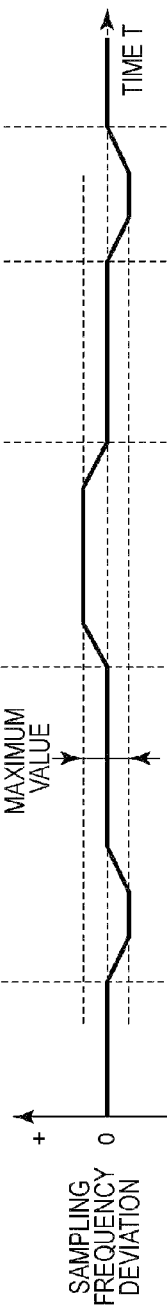
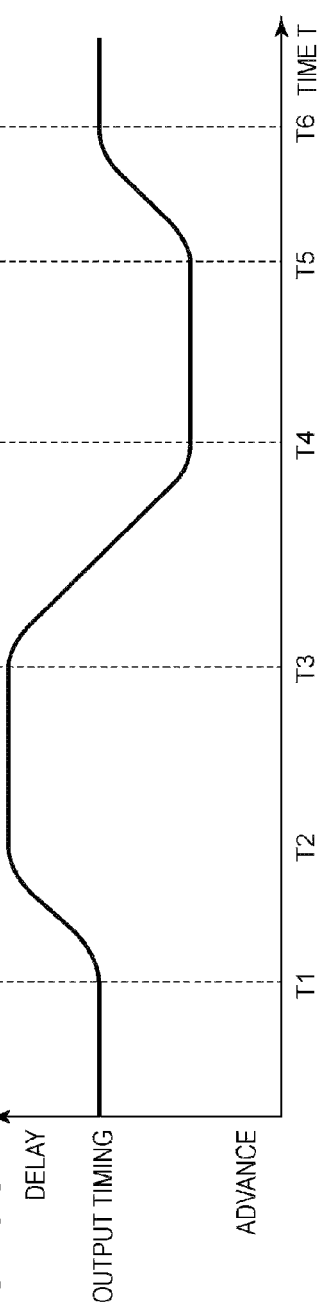
FIG. 6A
FIG. 6B
FIG. 6C

REPRODUCTION APPARATUS AND METHOD OF CONTROLLING REPRODUCTION APPARATUS

BACKGROUND

1. Field

Aspects of the present invention generally relate to a reproduction apparatus and a method of controlling a reproduction apparatus.

2. Description of the Related Art

In recent years, a camera provided with a group of micro lenses having different focal lengths (micro lens array) and an image pickup device having high resolution, called light field (registered trademark) camera, is known. An image that focuses on an arbitrary position can be reconstructed when the image is reproduced by using image data obtained by one time capturing by this type of camera.

For example, U.S. Pat. No. 4,410,804 discloses an image pickup apparatus using a two-dimensional image pickup device in which one micro lens and a plurality of divided photoelectric conversion units. This divided photoelectric conversion units are configured to receive pupil portion regions having different exit pupils of an image-taking lens through one micro lens, and a plurality of parallax images in accordance with the divided pupil portion regions can be generated from photoelectric conversion signals from the respective divided photoelectric conversion units. It is disclosed that focusing after capturing the image is realized by applying composite processing to a portion to be focused using the plurality of obtained parallax images.

However, when a moving image is captured by the light field (registered trademark) camera or by the image pickup apparatus of U.S. Pat. No. 4,410,804, audio suitable for a refocused position may not be reproduced.

That is, when a moving image is captured by a typical image pickup apparatus, directivity and a delay time of audio are determined in advance when the moving image is captured. When a moving image capable of refocusing is captured, there is a problem that the directivity and the delay time of the audio need to be manually adjusted when the image is reproduced.

SUMMARY

An aspect of the present invention generally relates to a reproduction apparatus including an image acquisition unit configured to acquire an image capable of refocusing, an audio acquisition unit configured to acquire audio associated with the image capable of refocusing, and a control unit configured to control a timing of an output of the audio obtained by the audio acquisition unit in accordance with a refocus position of the image capable of refocusing.

Further features of the present disclosure will become apparent from the following description of exemplary embodiments (with reference to the attached drawings).

BRIEF DESCRIPTION OF THE DRAWINGS

FIG. 5 is a diagram illustrating a relationship between a refocus image and a virtual focus position of the present embodiment.

FIGS. 6A, 6B, and 6C are diagrams for describing adjustment of an audio output timing of the present embodiment.

DESCRIPTION OF THE EMBODIMENTS

Hereinafter, exemplary embodiments will be described in detail with reference to the drawings. These embodiments are not limiting, and all of combinations of characteristics described in the embodiments are not necessarily indispensable for solution to the problems.

Note that function blocks described in the present embodiment are not necessarily individual pieces of hardware. That is, for example, some functions of the function blocks may be executed by a single piece of hardware. Alternatively, a function of one function block or functions of a plurality of function blocks may be executed by a cooperative operation of several pieces of hardware.

(Embodiment 1)

In the present embodiment, an image pickup apparatus that can capture a moving image capable of refocusing will be described as an example of a reproduction apparatus. An image pickup apparatus 100 of the present embodiment can record, on a recording medium, moving image data obtained by capturing a moving image capable of refocusing and audio data obtained when capturing the moving image. In addition, the image pickup apparatus 100 can reproduce the moving image data and the audio data recorded on the recording medium. When reproducing the data, the image pickup apparatus 100 can perform refocusing processing at an arbitrary position of the moving image, and can adjust an output timing of the audio when reproducing the data according to the refocus position. Note that the moving image capable of refocusing is configured from an image having a plurality of frames and audio data. That is, the image pickup apparatus of the present embodiment captures an image capable of refocusing times per second, multiplexes (associates) the image data capable of refocusing having a plurality of frames and audio data collected by a microphone, and records the multiplexed data on a recording medium.

Hereinafter, such an image pickup apparatus will be described.

Figure 1:
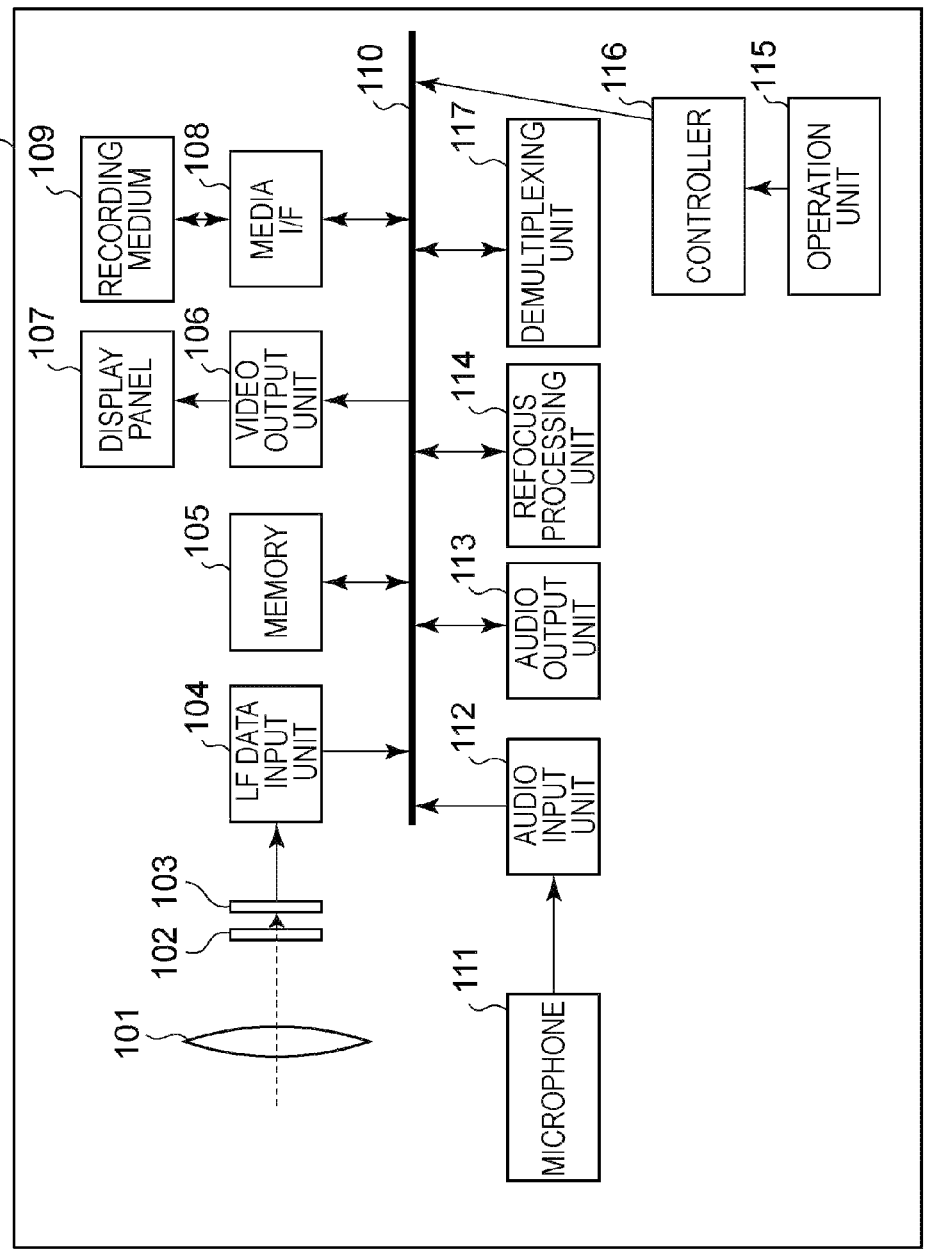
FIG. 1 is a block diagram of an image pickup apparatus 100 of the present embodiment.

FIG. 1 is a block diagram illustrating a configuration of the image pickup apparatus 100 of the present embodiment.

The image pickup apparatus 100 of the present embodiment includes, as illustrated in FIG. 1, a main lens 101, a micro lens array 102, an image pickup device 103, an LF data input unit 104, a memory 105, a video output unit 106, and a display panel 107. Further, the image pickup apparatus 100 includes a media I/F 108, a recording medium 109, a memory bus 110, a microphone 111, an audio input unit 112, an audio output unit 113, a refocus processing unit 114, an operation unit 115, a controller 116, a demultiplexing unit 117.

The image pickup apparatus 100 of the present embodiment basically operates by control of the controller 116, and blocks are controlled by the controller 116. Further, configuration elements are connected to the memory bus 110, and perform data exchange with the memory 105 to perform data processing. The memory 105 is a randomly accessible dynamic RAM at high speed. The controller 116 arbitrates memory access requests from configuration elements, and controls the configuration elements to enable time division data read/write with respect to the memory 105.

Next, blocks of the image pickup apparatus 100 will be described.

The controller 116 controls the blocks of the image pickup apparatus 100, and is made of, for example, a microcomputer, a combination of a CPU and a RAM, or the like. Note that CPU is an abbreviation of Central Processing Unit. RAM is an abbreviation of Random Access Memory.

The main lens 101 is an image-forming optical system made of a single lens or of a plurality of lenses, receives light of an object through a front face (left side in the drawing), and projects the light on a plane of the micro lens 102. Note that the main lens 101 may be configured to include a focus function and a zoom function.

The micro lens 102 is laid out between the main lens 101 and the image pickup device 103, disperses a light beam from the main lens 101 according to an incident angle, and emits the light beam to the image pickup device 103. The micro lens 102 is, for example, a micro lens array made of a plurality of lens groups.

The image pickup device 103 is a photoelectric conversion device, such as a CCD or CMOS sensor, in which a plurality of pixels (photoelectric conversion devices) are laid out in a matrix manner, converts light entered from micro lens 102 into the an electrical signal, and outputs the electrical signal to the LF data input unit 104 as an image signal.

The LF data input unit 104 digitalizes the image signal obtained from the image pickup device 103, performs development processing to convert the image signal into an image data (hereinafter, LF data) capable of refocusing, and stores the image data in an LF data region of the memory 105. In the present embodiment, the LF data obtained by capturing is stored in the LF data region of the memory 105, and afterwards, fifteen LF data and 0.5-second audio data are multiplexed and recorded on the recording medium.

The microphone 111 converts collected audio into an electrical signal to acquire an audio signal, and outputs the audio signal to the audio input unit 112.

The audio input unit 112 digitalizes the audio signal obtained by the microphone 111, and stores the digital data in an audio data region of the memory 105. Note that the audio data may be compressed using a predetermined audio compression technology.

The demultiplexing unit 117 performs multiplex/demultiplex of video stream data. That is, when an image is captured, the demultiplexing unit 117 reads out a plurality of LF data and audio data obtained by capturing from the memory 105, and multiplexes the data in a predetermined format to generate multiplexed stream data. In addition, the demultiplexing unit 11 multiplexes lens information and capturing information to be used in the refocus processing unit 114 into multiplexed stream data. The demultiplexing unit 117 stores the generated multiplexed stream data in a multiplexed stream data region of the memory 105. The lens information mentioned here is information related to a focal length of lens, for example. The capturing information is, for example, a focus position and an aperture value.

Further, when reproducing the data, the demultiplexing unit 117 reads out the multiplexed stream data having read out from the recording medium 109 described below and having temporarily stored in the multiplexed stream data region of the memory 105, and demultiplexes the data into a plurality of LF data and audio data. That is, the demultiplexing unit 117 performs acquisition of the image (LF data) capable of refocusing (acquisition of an image) and acquisition of audio of the audio data related to the image capable of refocusing (acquisition of audio data). The demultiplexing unit 117 then stores the plurality of demultiplexed LF data and audio data in the LF data region and the audio data region of the memory 105. In addition, the multiplexed lens information and the capturing information are demultiplexed at this time and stored in the memory 105.

The media I/F 108 is an interface that controls read/write of data with respect to the recording medium 109. The media I/F 108 records, on the recording medium 109, the multiplexed stream data in the multiplexed stream data region of the memory 105 when an image is captured. When the image is reproduced, the media I/F 108 reads out the multiplexed stream data from the recording medium 109 and stores the data in the multiplexed stream data region of the memory 105. Note that the media I/F 108 records the data in the recording medium 109 in a file system format such as FAT, and also performs generation and control of the file system, and the like.

The recording medium 109 is a hard disk drive or a non-volatile semiconductor memory (for example, a flash memory). Note that the recording medium is not limited to the semiconductor recording medium, and may be a recording medium such as a magnetic recording medium or an optical recording medium.

The refocus processing unit 114 reads out the LF data stored in the LF data region of the memory 105 in units of frames, performs refocus processing to generate a refocused video frame, and stores the video frame in a video signal region of the memory 105. Details of the refocus processing will be described.

The video output unit 106 reads out video data from the video signal region of the memory 105, and outputs the video data to the display panel 107 and to a video output terminal (not illustrated). The display panel 107 displays a video signal input from the video output unit 106 as a video, and is a liquid crystal panel, an organic EL panel, or the like, for example.

The audio output unit 113 reads out the audio data from the region of the audio data of the memory 105, outputs the audio data to an audio output terminal (not illustrated), performs analog conversion, and allows a speaker to output an audio signal. In addition, the audio output unit 113 performs processing of adjusting a delay time of the audio according to a refocus position by the refocus processing as described below.

The operation unit 115 is a shutter button, a setting button, various operation buttons, or a touch panel sensor laid out on a surface of the display panel 107, which is operated by the user. An operation signal indicating which button has been operated is transmitted to the controller 116.

Next, details of operations of the main lens 101, the micro lens 102, the image pickup device 103, and the LF data input unit 104 when capturing an image will be described in detail.

Figure 2A:
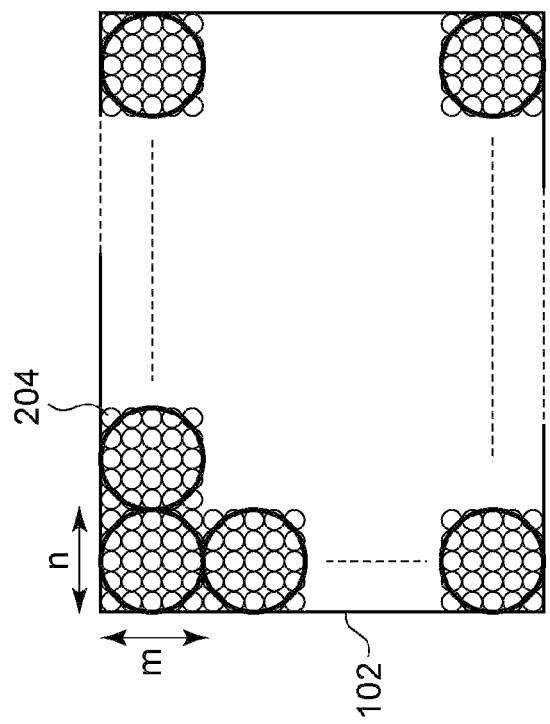
FIGS. 2A and 2B are illustrations of an optical system of the present embodiment.
Figure 2B:
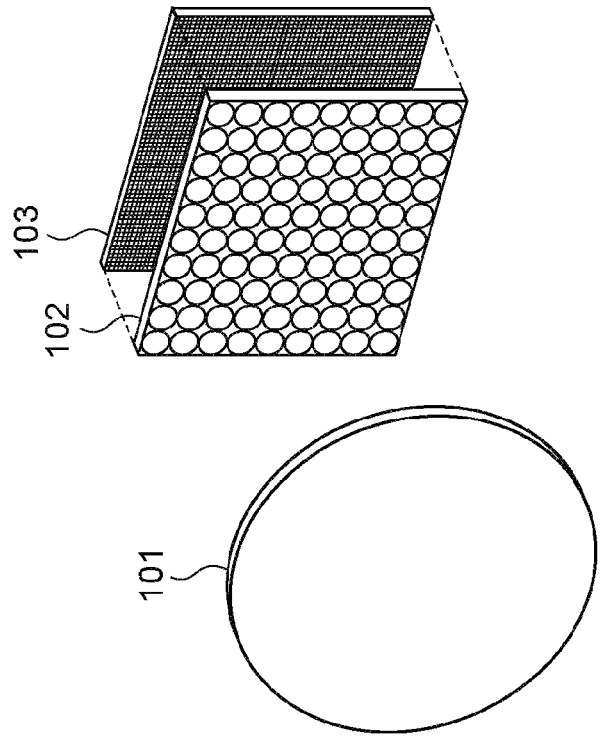
Figure 3:
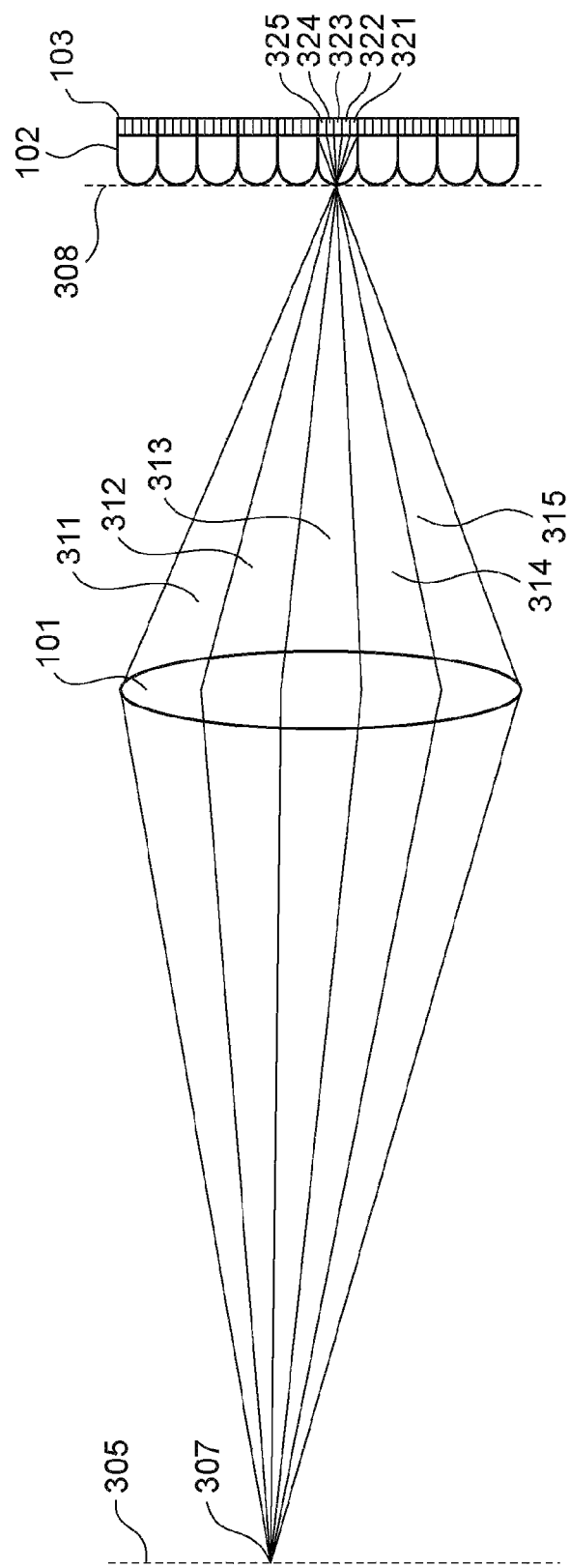
FIG. 3 is an illustration of an optical system of the present embodiment.

FIGS. 2 and 3 are diagrams illustrating an image pickup optical system of the present embodiment.

FIG. 2 illustrates pixels 204 of the image pickup device 103.

As illustrated in FIG. 2A, a plurality of the micro lenses 102 are laid out in front of the image pickup device 103 in a matrix manner. Note that the size and the number of the micro lenses in the present embodiment are not limited to the ones illustrated in the drawing.

Further, as illustrated in FIG. 2B, the image pickup device is laid out such that n×m pixels 240 are corresponding to one micro lens. The number of pixels of the image pickup device determines the number of divisions of a light beam. In the description of the present embodiment, a state is illustrated, in which the number of divisions of a light beam is 5×5, and 5×5 pixels of the image pickup device are laid out corresponding to one micro lens.

Further, as illustrated in FIG. 3, one point of light 307 released from an object 305 enters the main lens 101 as a light flux. The light flux having entered the main lens 101 is collected by the main lens 101 and is projected on an image forming plane 308 on a surface of the micro lenses 102. The projected light is dispersed in the micro lenses 102 according to an incident angle of the light, and is received by pixels 321 to 325 of the image pickup device 103. The light received by the pixels 321 to 325 is subjected to photoelectric conversion, and is output as image pickup signals.

Here, the light received by the pixel 321 is a light flux from an optical path 311, and the light received by the pixel 322 is a light flux from an optical path 312. Similarly, the light received by the pixel 323 is a light flux from an optical path 313, a light received by the pixel 324 is a light flux from the optical path 314, and the light received by the pixel 325 is a light flux from an optical path 315. The light received by the pixels 321 to 325 is the light from the same object but is received by different regions on the main lens surface, and each light has a parallax.

Here, a state has been described, in which an image of one point of light 307 of the object 305 is picked up. In fact, countless points of light from all objects in front of the main lens front face enter the main lens, and are projected such that the objects are formed images on the entire micro lens. Each of the micro lenses 102 disperses the projected light, and emits the light to the n×m pixels of the image pickup device.

Figure 4:
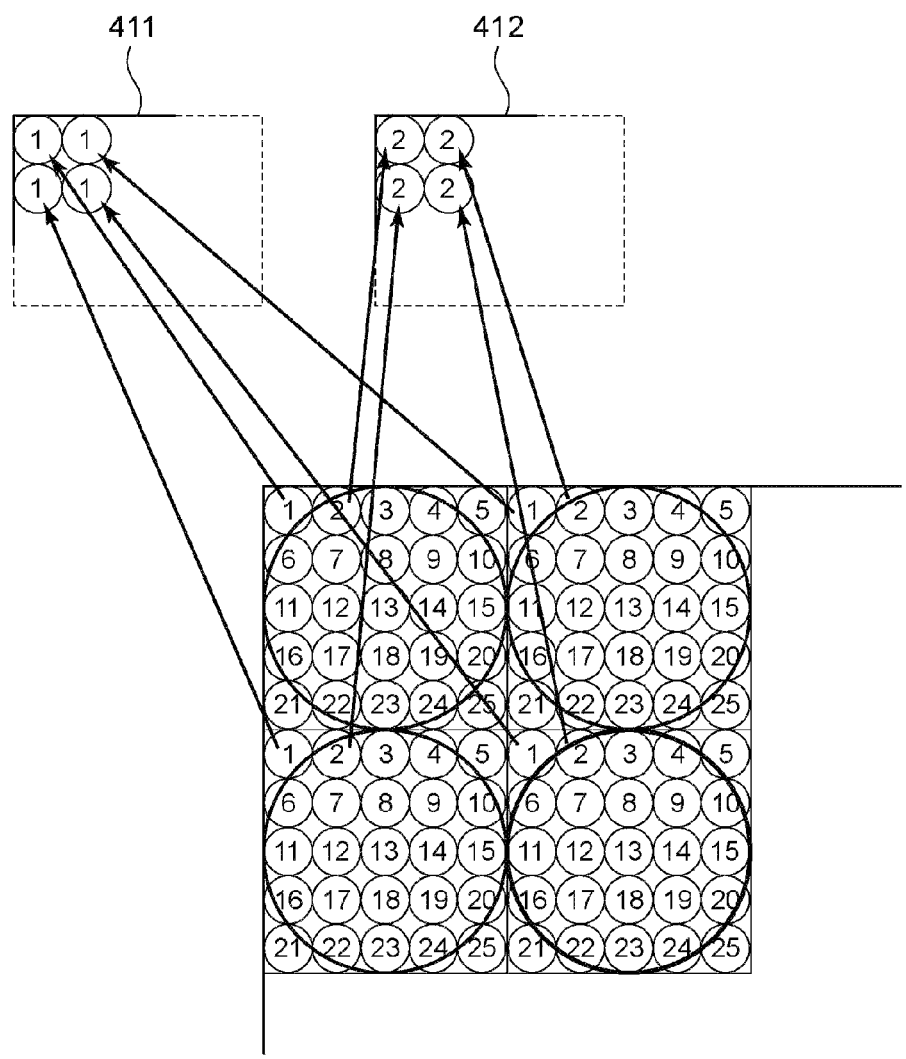
FIG. 4 is a diagram for describing generation of a parallax image of the present embodiment.

Here, the LF data input unit 104 generates, as illustrated in FIG. 4, parallax images in which pixels at the same positions of the n×m pixels corresponding to each lens of the micro lenses 102 are arranged in order. To be specific, a first parallax image 411 obtained by gathering only upper left pixels from among the respective n×m pixels, and a second parallax image 412 obtained by gathering only pixels to the upper left pixels' right from among the respective n×m pixels are generated. In the present embodiment, the 5×5 pixels are corresponding to each lens of the micro lenses 102, and thus, parallax images up to 25th parallax image are generated.

In this way, the LF data input unit 104 digitalizes the picked-up image pickup signal and performs the development processing, and generates the 1st to 25th parallax images to generate one LF data. That is, n×m parallax images corresponding to the micro lens are stored in the LF data.

Note that the reproduction apparatus executes the refocus processing of generating an image that focuses on a predetermined position by using all or a part of the n×m parallax images and shifting and performing composition of positions thereof.

Next, the refocus processing in the refocus processing unit 114 will be described.

The refocus processing unit 114 generates a refocus image having a plurality of focus distances from an imaging apparatus using the LF data stored in the LF data region of the memory 105 and the lens information and the capturing information when the image is captured.

First, the refocus processing unit 114 reads out the LF data demultiplexed from the multiplexed stream data having read out from the recording medium 109, and stored in the LF data region of the memory 105. As described above, each LF data stores a plurality of parallax images.

Next, the refocus processing unit 114 generates a plurality of refocus images. In the present embodiment, eight refocus images are generated using the plurality of parallax images stored in the LF data. However, the number of generation of the refocus image is not limited to eight. As illustrated in FIG. 5, a refocus image 501, a refocus image 502, and refocus images 503 to 508 respectively having the virtual focus positions of 1 m, 2 m, and 3 to 30 m are generated by composition of the plurality of parallax images stored in the LF data. Note that a relationship between shift amounts and the virtual focus positions of the parallax images can be obtained by an experiment in advance. Therefore, information obtained by the experiment is used. Note that the virtual focus position may be expressed as a refocus position. This information may be stored in the refocus processing unit 114, or may be multiplexed in the multiplexed stream data in advance when an image is picked up and used by being demultiplexed when the image is reproduced.

Next, processing of selecting a refocus image is performed. In this processing, an arbitrary region on a screen is selected by the controller 116 by an operation of the operation unit 115 by the user. The refocus processing unit 114 determines a refocus image in which a contrast of an image of the specified region is maximized. For example, the refocus processing unit 114 analyzes images of the specified positions in the refocus images 501 to 508, respectively, and determines an image having the highest contrast.

The refocus processing unit 114 then transmits a refocus image 506 to the video output unit 106.

In this way, the refocus processing unit 114 generates a plurality of refocus images and determines whether which refocus image is to be displayed.

Note that, in the present embodiment, the contrast in the region specified by the user is determined. However, a contrast in a predetermined region such as a screen center, and the like may be determined, for example. Alternatively, edge detection processing may be performed instead of determining a contrast or an image having a high contrast may be determined by performing a frequency analysis of an image.

An image that refocuses at an arbitrary region can be displayed during reproduction of a moving image by performing such processing in each frame of the moving image.

Next, an output of audio during reproduction of a moving image capable of refocusing will be described.

As described above, the "moving image capable of refocusing" recorded on the recording medium 109 is configured from multiplexed stream data made of a plurality of LF data and audio data. When the moving image is reproduced, the demultiplexing unit 117 demultiplexes the audio data from the multiplexed stream data and stores the audio data in the memory 105.

In addition, regarding a contrast of a specified region, when the refocus image 506 is determined to have the highest contrast, the refocus processing unit 114 transmits the information of the virtual focus position to the controller 116. Regarding the information of the refocus position, the refocus position is obtained from the shift amounts of the parallax images for generating the refocus image 506 based on the above-described shift amounts of the parallax images and the information indicating refocus positions. To be specific, when the refocus image 506 is selected, the refocus position is 10 m.

The controller 116 calculates a delay time of the audio based on the refocus position. To be specific, the audio from the refocus position of 10 m is delayed by 10÷340=0.0294 seconds and is collected where the sound speed is 340 m/s.

The controller 116 calculates the delay time, and adjusts a timing of an audio output in the audio output unit 113 based on the delay time.

When the audio data stored in the memory 105 is output, the audio output unit 113 synchronizes the audio data and a video to perform reproduction such that audio collected at a position of the image pickup apparatus is reproduced in a virtual sense, that is, the audio at a position of 0 m is reproduced. Therefore, when the reproduction is performed under this state, the audio output from a position that is 10 m away from the image pickup apparatus is delayed by 0.0294 seconds from the image (that is, a time of one frame if it is a case of a moving image having 30 frames per second). Therefore, the controller 116 controls the audio output unit 113 to adjust a timing of outputting the audio by the delay time of the audio corresponding to the virtual focus position.

The audio output unit 113 converts the audio data into an analog audio signal with a predetermined sampling frequency and outputs the audio signal. When adjusting the output timing of the audio, the audio output unit 114 varies the sampling frequency Fs (Hz). This operation will be described using FIG. 6.

FIG. 6A is a diagram illustrating a time change of the focus distance of the refocus image selected by the refocus processing unit 114. At times T1, T3, and T5, the user instructs a refocus position from the operation unit 115, and the focus distance of the refocus processing is started to change. At the time T1, an image position having the closer focus distance than a time before the time T1. Therefore, as illustrated in FIG. 6B, the controller 116 controls the audio output unit 113 to cause the sampling frequency Fs to be temporarily lower so that the audio output timing is delayed. At the time T3, an image position having a more distant focus distance than a time before the time T3 is selected. Therefore, as illustrated in FIG. 6B, the controller 116 controls the audio output unit 113 to cause the sampling frequency Fs to be temporarily higher so that the audio output timing is advanced. At this time, if a deviation of the sampling frequency Fs is made too large, degradation of sound quality such as change in frequency of original audio, and the like, may be caused. Therefore, when a maximum value of the deviation of a frequency that has allowable sound degradation and a maximum value of a time change of the deviation of the frequency, stable audio reproduction becomes possible. In order to realize it, periods of T1 to T2, T3 to T4, and T5 to T6 are required to change a lip-sync delay time.

Note that, if the refocus processing unit 114 immediately switches to a refocus image of the image position specified by the user, a delay between the image and the audio becomes large during change of the lip-sync delay time. Therefore, the refocus processing unit 114 may not immediately switch to the refocus image of the image position specified by the user. That is, during a time necessary for the change of the audio output timing, other refocus images at virtual focus positions between an objective refocus image and a refocus image being in display may be displayed in turn. By changing the focus distance of the refocus processing in this way, strangeness of a delay difference between the image and the audio can be removed.

As described above, when reproducing a moving image capable of refocusing, the image pickup apparatus 100 of the present embodiment can adjust an output timing of audio when reproducing the moving image in accordance with the focus region. Therefore, labor of manual adjustment can be reduced.

Note that in the present embodiment, the generation of the plurality of parallax images is performed by the LF data input unit 104 when recording an image. However, the refocus processing unit 114 may generate the parallax images when reproducing the image.

Further, the LF data input unit 104 may generate the plurality of refocus images when recording an image, and generate the LF data. In this case, the refocus processing unit 114 may just select the plurality of refocus images stored in the LF data.

The above-described exemplary embodiment is not limiting, and various modifications and changes are possible.

Note that, in the present embodiment, while an image pickup apparatus can capture and record a moving image capable of refocusing has been described as an example, any apparatus can be employed as long as one can reproduce a moving image capable of refocusing. For example, a personal computer, a television, a hard disk recorder, a car navigation system, a mobile phone, a smart phone, or a tablet-type information terminal may be employed. Also, a program for causing a computer to execute the above-described processing is included in the present embodiment.

(Embodiment 2)

In the present embodiment, as an example of a reproduction apparatus, an image pickup apparatus that can capture a moving image capable of refocusing will be described. An image pickup apparatus 700 of the present embodiment can record moving image data obtained by capturing a moving image capable of refocusing and audio data obtained when capturing the image on a recording medium. In addition, an image pickup apparatus can reproduce the moving image data and the audio data recorded on the recording medium. When reproducing data, the image pickup apparatus can perform refocusing processing at an arbitrary position of the moving image, and can adjust directional characteristics of the audio when reproducing data according to the refocus position. Note that the moving image capable of refocusing is configured from an image having a plurality of frames and the audio data. That is, the image pickup apparatus of the present embodiment captures an image capable of refocusing 30 times per second, multiplexes the image data capable of refocusing having a plurality of frames and the audio data collected by a microphone, and records the multiplexed data on a recording medium.

Hereinafter, such an image pickup apparatus will be described.

Figure 7:
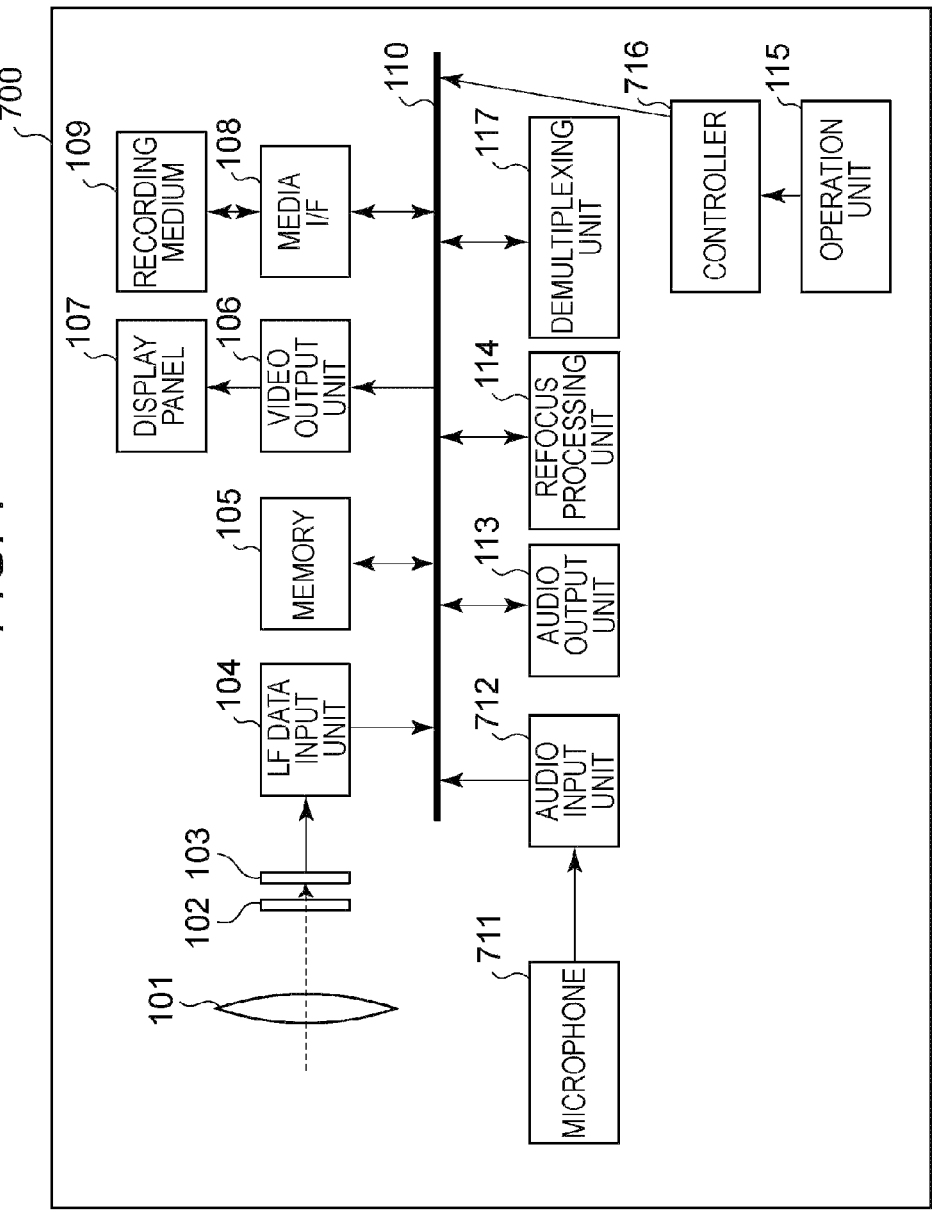
FIG. 7 is a block diagram of an image pickup apparatus 700 of the present embodiment.

FIG. 7 is a block diagram illustrating a configuration of the image pickup apparatus 700 of the present embodiment.

The image pickup apparatus 700 of the present embodiment includes, as illustrated in FIG. 7, a main lens 101, a micro lens array 102, an image pickup device 103, an LF data input unit 104, a memory 105, a video output unit 106, and a display panel 107. The image pickup apparatus 700 further includes a media I/F 108, a recording medium 109, a memory bus 110, a microphone 711, an audio input unit 712, an audio output unit 713, a refocus processing unit 114, an operation unit 115, a controller 716, and a demultiplexing unit 117.

The image pickup apparatus 700 of the present embodiment basically operates by control of the controller 716, and blocks are controlled by the controller 716. Further, configuration elements are connected to a memory bus 110, and perform data exchange with the memory 105 to perform data processing. The memory 105 is a randomly accessible dynamic RAM at high speed. The controller 716 arbitrates memory access requests from configuration elements, and controls the configuration elements to enable time division data read/write with respect to the memory 105.

Next, the blocks of the image pickup apparatus 700 will be described.

The controller 716 controls the blocks of the image pickup apparatus 700, and is made of, for example, a microcomputer, a combination of a CPU and a RAM, or the like. Note that CPU is an abbreviation of Central Processing Unit. RAM is an abbreviation of Random Access Memory.

Note that the main lens 101, the micro lens array 102, the image pickup device 103, the LF data input unit 104, the memory 105, the video output unit 106, and the display panel 107 are similar to those in Embodiment 1, and therefore, description thereof is omitted. In addition, the media I/F 108, the recording medium 109, the memory bus 110, the refocus processing unit 114, and the operation unit 115 are similar to those in Embodiment 1, and therefore, description thereof is omitted.

The microphone 711 converts collected audio into an electrical signal to acquire an audio signal, and outputs the audio signal to the audio input unit 712. In the present embodiment, the microphone 711 is configured from two or more microphones. For example, in the present embodiment, the microphone 711 is made of three microphones in a layout illustrated in FIG. 8A.

The audio input unit 712 digitalizes a plurality of audio signals obtained by the plurality of microphones of the microphone 711, and stores the digital data in an audio data region of the memory 105. Note that the audio data may be compressed using a predetermined audio compression technology.

The audio output unit 713 reads out the audio data from the region of the audio data of the memory 105, outputs the audio data to an audio output terminal (not illustrated), performs analog conversion, and allows a speaker to output an audio signal. In addition, the audio output unit 713 performs processing of adjusting directional characteristics of the audio in accordance with a refocused focus position by refocus processing described below.

Next, an output of audio during reproduction of a moving image capable of refocusing will be described.

First, the "moving image capable of refocusing" recorded on the recording medium 109 is configured from multiplexed stream data made of a plurality of LF data and audio data. When reproducing the image, the demultiplexing unit 117 demultiplexes the audio data from the multiplexed stream data and stores the audio data in the memory 105.

In addition, the refocus processing unit 114 transmits information of a virtual focus position to the controller 716 regarding a contrast of a specified region, when a refocus image 506 is determined to have the highest contrast. Regarding the virtual focus position, the virtual focus position is obtained from shift amounts of parallax images for generating the refocus image 506 based on the above-described shift amounts of the parallax images and the information indicating the virtual focus positions. To be specific, when the refocus image 506 is selected, the virtual focus position is 10 m. In addition, the refocus processing unit 114 transmits information of a direction of a position of the specified region to the controller 716.

Figure 8B:
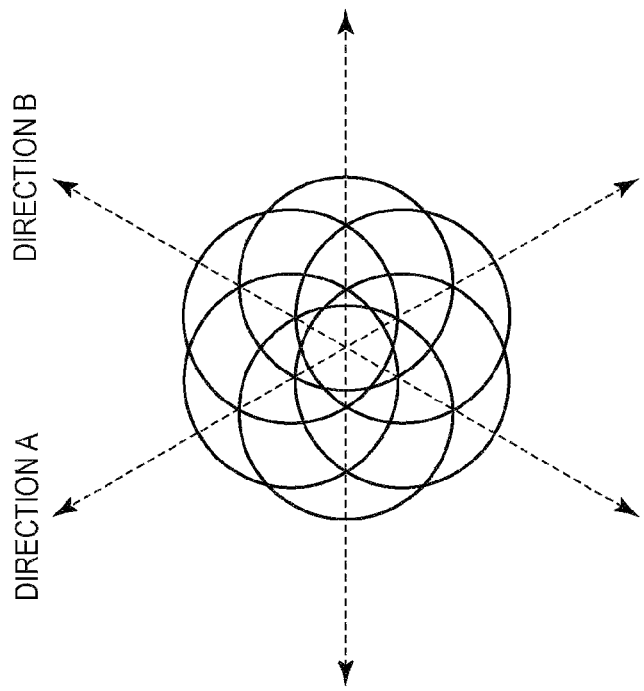
FIGS. 8A and 8B are diagrams illustrating a layout of microphones of the present embodiment.
Figure 8A:
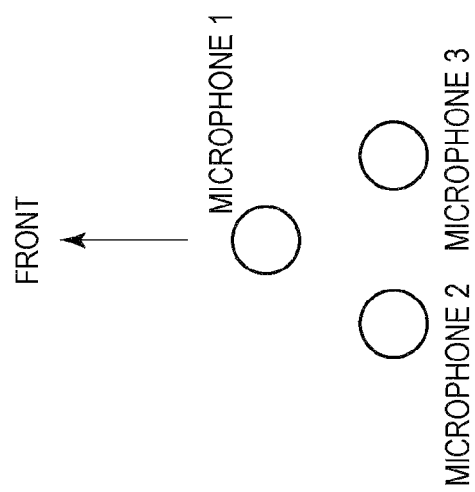

The controller 716 controls the audio output unit 713 to adjust the directional characteristics of the audio based on the virtual focus position and the direction of the specified region. In the present embodiment, audio obtained by the three microphones laid out like FIG. 8A is used. Therefore, for example, audio having 6 directivities like FIG. 8B can be generated. Audio generated by the microphones 1 and 3 is illustrated on a line in a direction A of FIG. 8B, and audio generated by the microphones 1 and 2 is illustrated on a line in a direction B. 6-channel audio can be generated by a similar method, and by mixing the 6-channel audio, audio having various directional characteristics can be generated.

Figure 9:
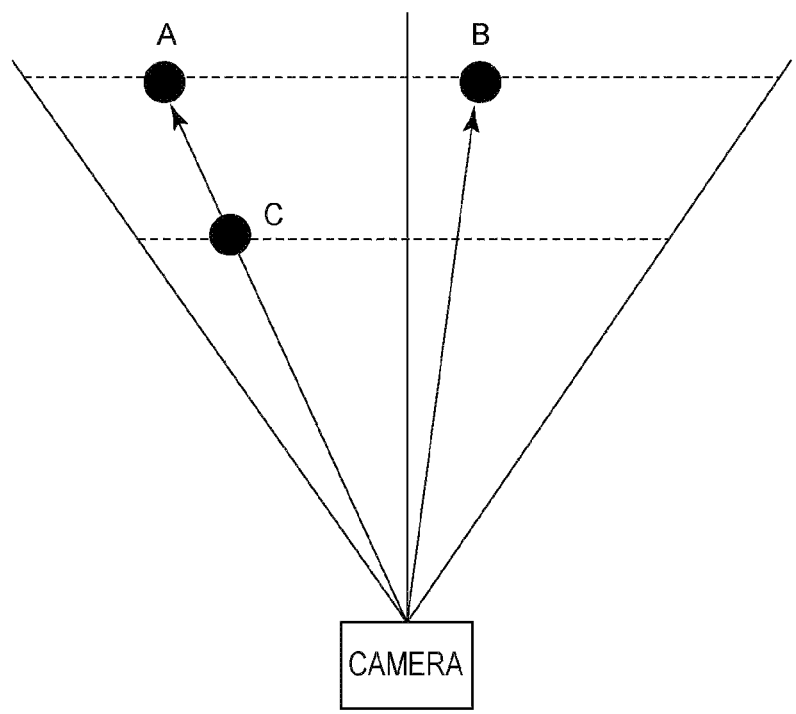
FIG. 9 is a diagram illustrating a focus position of the present embodiment.

For example, as illustrated in FIG. 9, a case where focused positions by the virtual focus positions and the directions of the specified regions are points A, B, and C will be described as an example. Note that the points A and B are in different directions but have the same focus distance, and the points A and C are in the same direction but have different focus distances.

In this case, the controller 716 controls the audio output unit 713 to mix generated 6-channel audio to have the directional characteristics of the audio as illustrated in FIG. 10 where the points are the virtual focus positions.

Figure 10A:
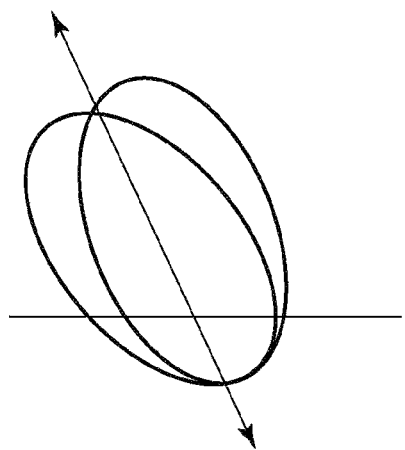
FIGS. 10A, 10B, and 10C are diagrams for describing adjustment of directional characteristics of audio of the present embodiment.
Figure 10B:
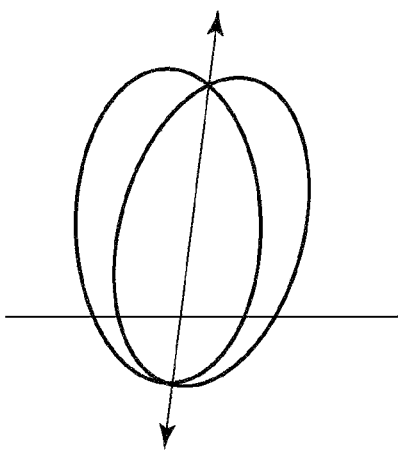
Figure 10C:
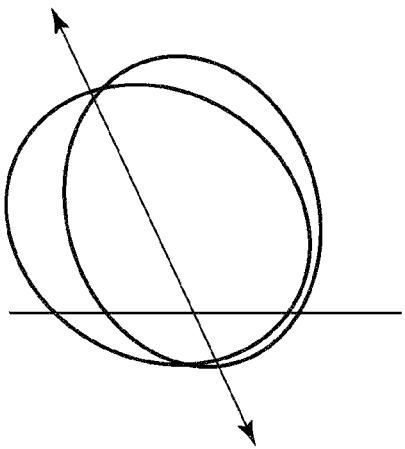

FIG. 10A illustrates the directional characteristics of the audio when the point A of FIG. 9 is the virtual focus position. FIG. 10B illustrates the directional characteristics of the audio when the point B of FIG. 9 is the virtual focus position. FIG. 10C illustrates the directional characteristics of the audio when the point C of FIG. 9 is the virtual focus position. As can be seen from the comparison between FIGS. 10A and 10B, audio having directivity in accordance with a specified position is generated. Further, as can be seen from the comparison between FIGS. 10A and 10C, audio is generated such that the directivity becomes narrower as the virtual focus position is more distant.

Note that, in the present embodiment, the controller 716 changes the directional characteristics of the audio. However, similarly to Embodiment 1, an output timing may be adjusted.

As described above, when reproducing a moving image capable of refocusing, the image pickup apparatus 700 of the present embodiment can adjust the output timing of the audio when reproducing the image in accordance with the focus region. Therefore, labor of manual adjustment can be reduced.

Note that in the present embodiment, the generation of the plurality of parallax images is performed by the LF data input unit 104 when recording an image. However, the refocus processing unit 114 may generate the parallax images when reproducing the image.

Further, the LF data input unit 104 may generate the plurality of refocus images when recording an image, and generate the LF data. In this case, the refocus processing unit 114 may just select the plurality of refocus images stored in the LF data.

The above-described exemplary embodiment is not limiting, and various modifications and changes are possible.

Note that, in the present embodiment, while an image pickup apparatus can capture and record a moving image capable of refocusing has been described as an example, any apparatus can be employed as long as one can reproduce a moving image capable of refocusing. For example, a personal computer, a television, a hard disk recorder, a car navigation system, a mobile phone, a smart phone, or a tablet-type information terminal may be employed. Also, a program for causing a computer to execute the above-described processing is included in the idea of the present embodiment.

Other Embodiments

Additional embodiments can also be realized by a computer of a system or apparatus that reads out and executes computer executable instructions recorded on a storage medium (e.g., computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s).

The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that these embodiments are not limiting. The scope of the following claims is to be accorded the broadest interpretation so as to encompass all such modifications and equivalent structures and functions.

This application claims the benefit of Japanese Patent Application No. 2012-192926, filed Sep. 3, 2012, which is hereby incorporated by reference herein in its entirety.

What is claimed is:

1. A reproduction apparatus comprising:
   an image acquisition unit configured to acquire an image capable of refocusing;
   an audio acquisition unit configured to acquire audio associated with the image capable of refocusing; and
   a control unit configured to control a timing of an output of the audio obtained by the audio acquisition unit in accordance with a refocus position of the image capable of refocusing.

2. The reproduction apparatus according to claim 1, wherein the control unit controls the timing of an output of the audio by adjusting a sampling frequency of the audio.

3. A reproduction apparatus comprising:
   an image acquisition unit configured to acquire an image capable of refocusing;
   an audio acquisition unit configured to acquire audio associated with the image capable of refocusing; and
   a control unit configured to control directional characteristics of the audio obtained by the audio acquisition unit in accordance with a refocus position of the image capable of refocusing.

4. A method of controlling a reproduction apparatus, the method comprising:
   an image acquisition step of acquiring an image capable of refocusing;
   an audio acquisition step of acquiring audio associated with the image capable of refocusing; and
   a control step of controlling a timing of an output of the audio obtained by the audio acquisition step in accordance with a refocus position of the image capable of refocusing.

5. The method according to claim 4, wherein the control step controls the timing of an output of the audio by adjusting a sampling frequency of the audio.

6. A method of controlling a reproduction apparatus, the method comprising:
   an image acquisition step of acquiring an image capable of refocusing;
   an audio acquisition step of acquiring audio associated with the image capable of refocusing; and
   a control step of controlling directional characteristics of the audio obtained by the audio acquisition step in accordance with a refocus position of the image capable of refocusing.

7. The reproduction apparatus according to claim 1, further comprising:
   an image processing unit configured to generate an image for outputting to a display device using the image capable of refocusing acquired by the image acquisition unit,
   wherein the image processing unit generates a plurality of refocus images having different focus positions using the image capable of refocusing and selects one of the plurality of refocus images as the image for outputting, and
   wherein the control unit controls the timing of output of the audio obtained by the audio acquisition unit in accordance with the refocus position of the image for outputting.

8. The reproduction apparatus according to claim 7, wherein the image processing unit generates the plurality of refocus images every frame of the image capable of refocusing.

9. The reproduction apparatus according to claim 7, wherein the image processing unit selects one of the plurality of refocus images in accordance with an area, which is designated by a user, in a picture of the image capable of refocusing.

10. The reproduction apparatus according to claim 9, wherein the image processing unit selects one of the plurality of refocus images in accordance with a contrast of the designated area in each of the plurality of refocus images.

* * * * *